(12) United States Patent
Zhu

(10) Patent No.: US 11,961,787 B2
(45) Date of Patent: Apr. 16, 2024

(54) SEMICONDUCTOR DEVICE WITH SIDEWALL INTERCONNECTION STRUCTURE AND METHOD FOR MANUFACTURING THE SAME, AND ELECTRONIC APPARATUS

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 338 days.

(21) Appl. No.: 17/545,676

(22) Filed: Dec. 8, 2021

(65) Prior Publication Data

US 2022/0189853 A1     Jun. 16, 2022

(30) Foreign Application Priority Data

Dec. 11, 2020   (CN) .......................... 202011463247.9

(51) Int. Cl.
  *H01L 21/00*   (2006.01)
  *H01L 21/768*  (2006.01)
  (Continued)

(52) U.S. Cl.
  CPC ...... *H01L 23/481* (2013.01); *H01L 21/76877* (2013.01); *H01L 23/528* (2013.01)

(58) Field of Classification Search
  CPC ............ H01L 23/481; H01L 21/76877; H01L 23/528
  See application file for complete search history.

(56) References Cited

U.S. PATENT DOCUMENTS 8,969,930 B2 *  3/2015  Yin ......................... H01L 29/78
                                                      257/E29.22
 11,450,574 B2 *  9/2022  Shih .................... H01L 27/0922
  (Continued)

FOREIGN PATENT DOCUMENTS

CN    110970379 A  *  4/2020   ....... H01L 21/76801
  CN    110993583 A  *  4/2020   ......... H01L 21/7682
  (Continued)

*Primary Examiner* — Laura M Menz
(74) *Attorney, Agent, or Firm* — Christensen, Fonder, Dardi & Herbert PLLC

(57) ABSTRACT

A semiconductor device with a sidewall interconnection structure and a method for manufacturing the same, and an electronic apparatus including the semiconductor device are provided. According to embodiments, the semiconductor device includes: a vertical stack including a plurality of element layers, wherein each element layer of the plurality of element layers includes a plurality of semiconductor elements and a metallization layer for the plurality of semiconductor elements; and an interconnection structure laterally adjoined the vertical stack. The interconnection structure includes: an electrical isolation layer; and a conductive structure in the electrical isolation layer, wherein at least a part of a conductive structure in the metallization layer of the each element layer is in contact with and electrically connected to the conductive structure at a corresponding height in the interconnection structure in a lateral direction.

21 Claims, 12 Drawing Sheets

(51) Int. Cl.
   *H01L 23/48*   (2006.01)
   *H01L 23/528*  (2006.01)

(56) References Cited

U.S. PATENT DOCUMENTS

| | | | | |
|---|---|---|---|---|
| 11,664,374 | B2* | 5/2023 | Chung | H01L 21/823878 |
| | | | | 257/365 |
| 11,749,650 | B2* | 9/2023 | Zhu | H01L 23/485 |
| | | | | 257/303 |
| 11,810,902 | B2* | 11/2023 | Zhu | H01L 27/088 |
| 2012/0061738 | A1* | 3/2012 | Yin | H01L 21/28247 |
| | | | | 257/288 |
| 2021/0233819 | A1* | 7/2021 | Shih | H01L 21/823878 |
| 2022/0189853 | A1* | 6/2022 | Zhu | H01L 23/481 |
| 2022/0189925 | A1* | 6/2022 | Zhu | H01L 27/088 |
| 2022/0189926 | A1* | 6/2022 | Zhu | H01L 21/76898 |
| 2022/0254702 | A1* | 8/2022 | Zhu | H01L 21/4871 |
| 2022/0285506 | A1* | 9/2022 | Zhu | H10B 51/20 |
| 2022/0319921 | A1* | 10/2022 | Yang | H01L 21/76843 |
| 2023/0005839 | A1* | 1/2023 | Zhu | H01L 21/76816 |
| 2023/0121515 | A1* | 4/2023 | Hiblot | H01L 29/41766 |
| | | | | 257/401 |
| 2023/0269940 | A1* | 8/2023 | Zhu | H01L 29/775 |
| | | | | 257/314 |
| 2023/0402392 | A1* | 12/2023 | Zhu | H01L 27/092 |

FOREIGN PATENT DOCUMENTS

| | | | | | |
|---|---|---|---|---|---|
| CN | 112582374 | A | * | 3/2021 | ......... H01L 21/4857 |
| CN | 112582375 | A | * | 3/2021 | ......... H01L 21/4857 |
| CN | 112582376 | A | * | 3/2021 | ......... H01L 21/4857 |
| CN | 112582377 | A | * | 3/2021 | ......... H01L 21/4857 |
| CN | 112909012 | A | * | 6/2021 | ........ H01L 27/11565 |
| CN | 112992857 | A | * | 6/2021 | ......... H01L 21/4871 |
| CN | 113629061 | A | * | 11/2021 | ......... H01L 23/5283 |
| CN | 113707667 | A | * | 11/2021 | ......... H01L 25/0657 |
| CN | 115188728 | A | * | 10/2022 | |
| CN | 116864481 | A | * | 10/2023 | |
| CN | 112582377 | B | * | 11/2023 | ......... H01L 21/4857 |
| TW | 202029463 | A | * | 8/2020 | |
| TW | 202101684 | A | * | 1/2021 | ........ H01L 23/5221 |
| WO | WO-2021109722 | A1 | * | 6/2021 | ......... H01L 21/7682 |
| WO | WO-2021109795 | A1 | * | 6/2021 | ....... H01L 21/76801 |
| WO | WO-2022121382 | A1 | * | 6/2022 | ......... H01L 21/4857 |

* cited by examiner

SEMICONDUCTOR DEVICE WITH SIDEWALL INTERCONNECTION STRUCTURE AND METHOD FOR MANUFACTURING THE SAME, AND ELECTRONIC APPARATUS

CROSS-REFERENCE TO RELATED APPLICATION(S)

This application claims the priority of the Chinese patent application 202011463247.9 filed on Dec. 11, 2020, which is incorporated herein by reference in its entirety.

TECHNICAL FIELD

The present disclosure relates to a field of semiconductor, and in particular to a semiconductor device with a sidewall interconnection structure and a method for manufacturing the same, and an electronic apparatus including the semiconductor device.

BACKGROUND

As a semiconductor element becomes more and more miniaturized, it has become more and more difficult to manufacture a high-density interconnection structure since it is difficult to reduce a size in a lateral direction. In addition, in order to increase an integration density, a plurality of element layers may be stacked. It is desirable to be able to provide interconnections for such stacked element layers in a flexible manner.

SUMMARY

In view of this, the purpose of the present disclosure is at least partly to provide a semiconductor device with a sidewall interconnection structure and a method for manufacturing the same, and an electronic apparatus including the semiconductor device.

According to an aspect of the present disclosure, a semiconductor device is provided, including: a vertical stack including a plurality of element layers, wherein each element layer of the plurality of element layers includes a plurality of semiconductor elements and a metallization layer for the plurality of semiconductor elements; and an interconnection structure laterally adjoined the vertical stack, wherein the interconnection structure includes: an electrical isolation layer; and a conductive structure in the electrical isolation layer, wherein at least a part of a conductive structure in the metallization layer of the each element layer is in contact with and electrically connected to the conductive structure at a corresponding height in the interconnection structure in a lateral direction.

According to another aspect of the present disclosure, a method for manufacturing a semiconductor device is provided, including: stacking a plurality of element layers vertically, wherein each element layer of the plurality of element layers includes a plurality of semiconductor elements and a metallization layer for the plurality of semiconductor elements; providing a vertical stack including the plurality of element layers on a carrier substrate, and forming an interconnection structure laterally adjoined the vertical stack on the carrier substrate, wherein the interconnection structure includes an electrical isolation layer and a conductive structure in the electrical isolation layer, wherein the method further including: controlling a height of the conductive structure in the interconnection structure so that at least a part of a conductive structure in the metallization layer of the each element layer is in contact with and electrically connected to the conductive structure at a corresponding height in the interconnection structure in a lateral direction.

According to another aspect of the present disclosure, an electronic apparatus is provided, including the above-mentioned semiconductor device.

BRIEF DESCRIPTION OF THE DRAWINGS

Through the following description of the embodiments of the present disclosure with reference to the accompanying drawings, the above and other objectives, features, and advantages of the present disclosure will become more apparent, and in the accompanying drawings.

Throughout the drawings, the same or similar reference numerals indicate the same or similar components.

DETAILED DESCRIPTION OF EMBODIMENTS

Figure 1:
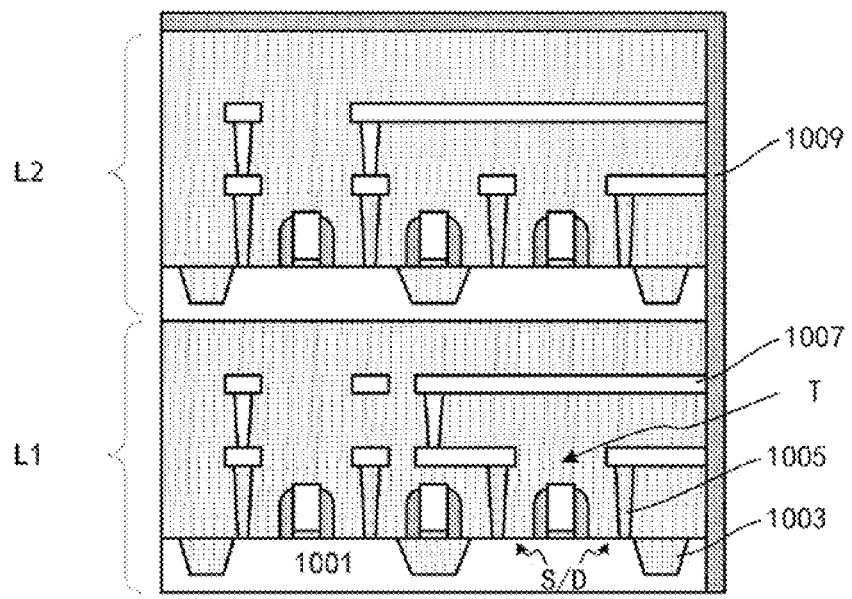
FIGS. 1 to 19 schematically show some stages in a process for manufacturing a semiconductor device, particularly manufacturing an interconnection structure therein, according to the embodiments of the present disclosure.

Hereinafter, the embodiments of the present disclosure will be described with reference to the accompanying drawings. However, it should be understood that these descriptions are only exemplary and are not intended to limit the scope of the present disclosure. In addition, in the following description, descriptions of well-known structures and technologies are omitted to avoid unnecessarily obscuring the concept of the present disclosure.

In the drawings, various structural schematic diagrams according to the embodiments of the present disclosure are shown. These drawings are not drawn to scale, some details are enlarged and some details may be omitted for clarity of presentation. Shapes of the various regions and layers, as well as the relative size and positional relationship between them which are shown in the drawings are only exemplary. In practice, there may be deviations due to manufacturing tolerances or technical limitations. Areas/layers with different shapes, sizes, and relative positions may be designed according to actual needs by those skilled in the art.

In the context of the present disclosure, when a layer/element is referred to as being "on" another layer/element, the layer/element may be directly on the another layer/element, or there may be an intermediate layer/element between them. In addition, if a layer/element is located "on" another layer/element in an orientation, the layer/element may be located "under" the another layer/element when the orientation is reversed.

According to the embodiments of the present disclosure, a semiconductor device with a sidewall interconnection structure is provided. The so-called "sidewall" interconnection structure refers to this interconnection structure is formed in a lateral direction (for example, a direction substantially parallel to a surface of the substrate) of elements to be interconnected, and therefore may be interconnected with components to be interconnected (for example, conductive structures in a metallization layer of an element layer, etc.) in the element through a sidewall of the element. Due to differences in height and/or orientation of the components to be interconnected, conductive structures interconnected thereto may be formed on sidewalls of the components, respectively.

For example, the metallization layer of the element layer may include an interconnection wire layer and a via hole layer. Different interconnection wire layers may be at different heights (relative to the substrate on which the element is formed), and be interconnected with each other through the via hole layer. Thus, a conductive structure in an interconnection wire layer may be connected to a conductive structure (for example, an interconnection wire and/or a via hole) in the interconnection structure at a first height, and a conductive structure in another interconnection wire layer may be connected to a conductive structure in the interconnection structure at a second height.

A plurality of element layers may be stacked to form a vertical stack to increase an integration density. The interconnection structure may be laterally adjoined the vertical stack. In addition, a plurality of vertical stacks may be provided on the substrate. The interconnection structure may be formed between the vertical stacks, so as to electrically connect elements that need to be interconnected within or between the vertical stacks. More specifically, at a position where the interconnection structure adjoined the component that needs to be electrically connected, (the sidewall) of the conductive structure in the interconnection structure is exposed, and (the sidewall) of the component is also exposed, so that both of them may be in contact with each other and therefore electrically connected. There may be an observable interface between the interconnection structure and the element. In order to realize the interconnection in various directions, the interconnection structure may surround each vertical stack. A part of the vertical stack may only be provided with an interconnection structure at a sidewall that needs to be electrically connected.

The interconnection structure may include an interconnection wire layer and a via hole layer provided in an electrical isolation layer (for example, a dielectric layer). The interconnection wire layer and the via hole layer may be arranged alternately with each other. The interconnection wire layer may realize the interconnection in a same layer, and the via hole layer may realize the interconnection between different layers. The conductive structure in the interconnection wire layer may include a body portion extending in a corresponding interconnection wire layer and a barrier layer surrounding the body portion.

Such semiconductor device may be manufactured as follows. For example, a plurality of element layers may be stacked on the substrate, and each element layer may include a plurality of semiconductor elements and a metallization layer for these elements. Components that need to be electrically connected in each element layer (for example, the conductive structures in the metallization layer) may be exposed at the sidewall of the stack. The stack may be provided on the carrier substrate. An interconnection structure laterally adjoined the stack may be formed on the carrier substrate, thereby interconnecting the components exposed at the sidewall of the stack.

The interconnection structure may be formed in layers to connect components at different heights. For example, a dielectric material may be formed on the carrier substrate, and an interconnection wire may be formed on the dielectric material. Then, the dielectric material may be further formed to bury the interconnection wire, and a via hole may be formed in the further formed dielectric material. By repeating these processes multiple times, an interconnection structure including a plurality of interconnection wire layers and a plurality of via hole layers is formed. Heights of the interconnection wire and the via hole may be controlled by the formation height of the dielectric material.

The present disclosure may be provided in various manners, some examples of which are described below. In the following description, a selection of various materials is involved. In addition to considering functions of the materials (for example, the semiconductor material is used to form the active region, the dielectric material is used to form the electrical isolation, and the conductive material is used to form the interconnection wire and the via hole), the selection of the material further considers an etching selectivity. In the following description, a required etching selectivity may or may not be indicated. It should be clear to those skilled in the art that when it is mentioned below that a certain material layer is etched, if it is not mentioned that other layers are also etched or the drawings do not show that other layers are also etched, this etching may be selective, and the material layer may have etching selectivity relative to other layers exposed to a same etching recipe.

FIGS. 1 to 19 schematically show some stages in a process for manufacturing a semiconductor device, particularly manufacturing an interconnection structure therein, according to the embodiments of the present disclosure.

As shown in FIG. 1, a stack of element layers may be provided. A stack including two element layers L1 and L2 is shown in FIG. 1. However, the present disclosure is not limited to this. A number of element layers may be greater to achieve a greater integration density. Each element layer may include a same layout or different layouts to achieve a same function or different functions.

Each element layer, such as the element layer L1, may be an existing or newly developed IC, and may include a substrate 1001. The substrate 1001 may be a substrate in various forms, including but not limited to a bulk semiconductor material substrate such as a bulk Si substrate, a semiconductor-on-insulator (SOI) substrate, a compound semiconductor substrate such as a SiGe substrate, and the like. The bulk Si substrate such as a silicon wafer is taken as an example for description.

In the substrate 1001, an active region may be defined by an isolation portion 1003, such as shallow trench isolation (STI). For example, the isolation portion 1003 may be formed by etching a trench in the substrate 1001 and filling the trench with a dielectric material such as oxide (for example, silicon oxide).

A semiconductor element T, such as a metal oxide semiconductor field effect transistor (MOSFET), a fin field effect transistor (FinFET), a nanowire field effect transistor, etc. may be formed on the active region. The semiconductor element T may include: a gate dielectric layer and a gate electrode formed on the active region; and a source region S and a drain region D formed on both sides of the gate electrode in the active region. Gate spacers of, for example, nitride (for example, silicon nitride) may be formed on sidewalls of the gate dielectric layer and the gate electrode. A metal silicide may be formed on the source region S and the drain region D to improve electrical contact performance. The semiconductor element T may be a planar element such as a planar MOSFET or a three-dimensional element such as a FinFET. In a case of FinFET, the active region may be formed in a form of a fin protruding with respect to a surface of the substrate.

Contact plugs 1005 may be formed on the source region S and the drain region D to realize electrical connections with the source region S and the drain region D. In addition, a metallization layer 1007 may further be formed. For example, the metallization layer 1007 may include a first interconnection wire layer in contact with the contact plugs 1005, a second interconnection wire layer above the first interconnection wire layer, and a via hole layer between the first interconnection wire layer and the second interconnection wire layer, and the via hole layer is used to electrically connect the first interconnection wire layer and the second interconnection wire layer. The contact plugs 1005 and the metallization layer 1007 may be surrounded by an interlayer dielectric layer such as oxide. The metallization layer 1007 is shown as including two interconnection wire layers and one via hole layer. However, the present disclosure is not limited to this. For example, the metallization layer 1007 may include more or fewer layers.

A part of conductive structures in the metallization layer 1007 (for example, conductive structures in the first interconnection wire layer and the second interconnection wire layer in FIG. 1) may extend laterally so as to be exposed on a sidewall of the stack (a right sidewall in the drawing). The conductive structures may also be exposed on other sidewalls of the stack. In order to protect the elements in the stack, a protection layer 1009 of, for example, nitride may be formed on surfaces (including a top surface and sidewalls) of the stack.

In this example, the conductive structure in the interconnection structure for the gate electrode is not shown. However, those skilled in the art should realize that the conductive structure for the gate electrode may also be similarly arranged.

In addition, each element layer may also be provided with an alignment mark region (not shown). An alignment mark in the alignment mark region may help alignment when the interconnection structure is formed subsequently.

Figure 2:
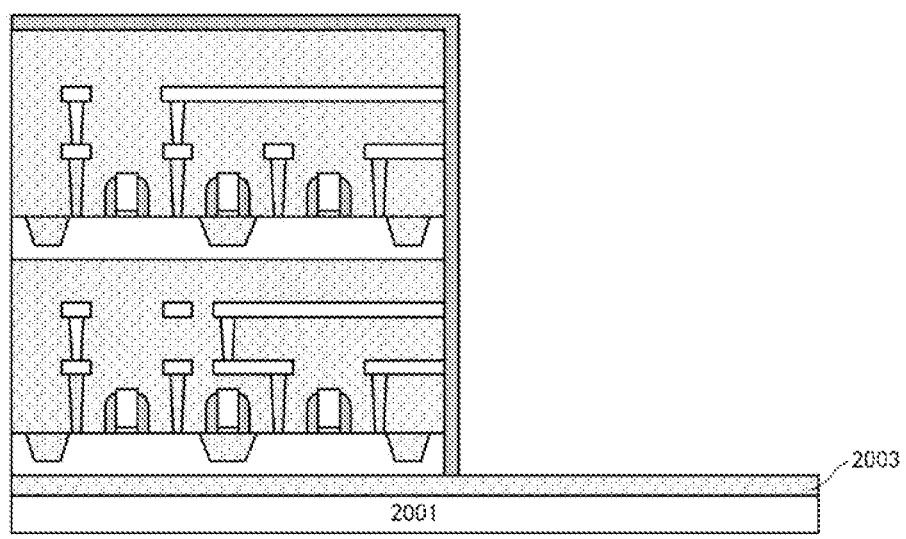

Then, as shown in FIG. 2, the stack of element layers may be attached/mounted on a carrier wafer or substrate 2001, for example, by bonding. An insulator 2003 such as oxide may be provided between the stack of element layers and the carrier wafer or substrate 2001.

Next, a sidewall interconnection structure adjacent to the stack of element layers may be formed on the carrier wafer or substrate 2001 to interconnect the elements in the stack of element layers, particularly elements in different element layers, with each other. As the interconnection structure is adjacent to the element in a lateral direction and is in contact with a sidewall of a component that needs to be electrically connected in the element, the interconnection structure may be referred to as a sidewall interconnection structure. The interconnection structure may include various conductive structures, such as interconnection wires, via holes, and the like. When an interconnection wire is formed, in order to avoid a difficulty in etching a groove in a conventional process and then filling the groove with a conductive material such as metal, according to the embodiments of the present disclosure, the conductive structure may be formed firstly and then a dielectric material is filled.

For this stack of element layers, a lowermost layer that needs to be electrically connected is the first interconnection wire layer in the element layer L1. A conductive structure for the interconnection wire layer may be formed firstly.

Figure 3:
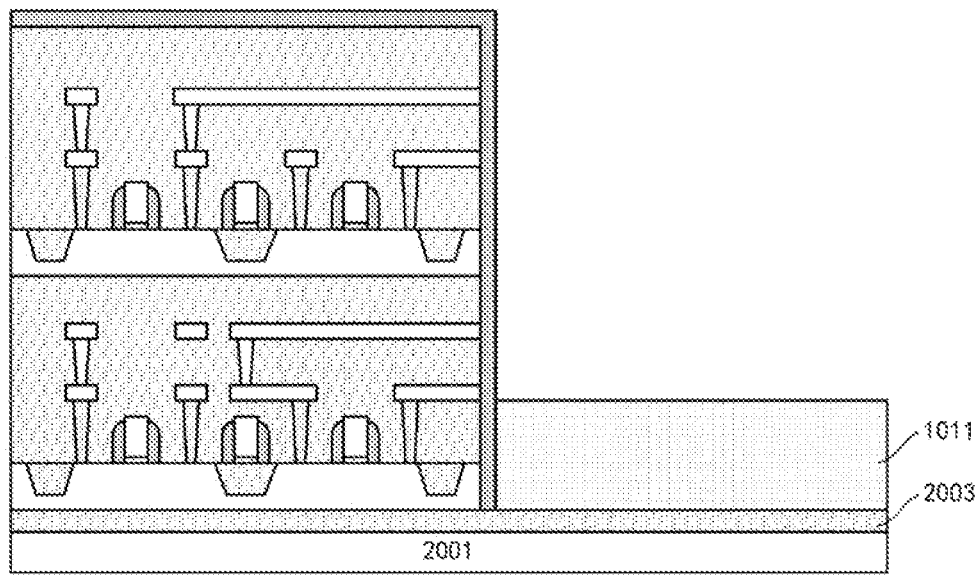

For example, as shown in FIG. 3, a dielectric layer 1011 may be formed on the carrier wafer or substrate 2001 to define a height of the conductive structure to be formed. The dielectric layer 1011 may include a dielectric material having etching selectivity with respect to an interlayer dielectric layer (for example, oxide) and a protection layer 1009 (for example, nitride), such as SiC or other low-k dielectric materials. The dielectric material may be deposited, and the deposited dielectric material may be planarized, for example, by chemical mechanical polishing (CMP) (which may be stopped at the protection layer 1009), and then etched back, for example, by reactive ion etching (RIE) to form the dielectric layer 1011. In order to better control a depth of etch-back, atomic layer etching (ALE) may be used for the etch-back. A top surface of the dielectric layer 1011 may be close to but lower than a bottom surface of the first interconnection wire layer in the element layer L1, so that the conductive structure subsequently formed on the dielectric layer 1011 may be in contact with the conductive structure in the first interconnection wire layer over the entire height of the first interconnection wire layer.

Figure 4:
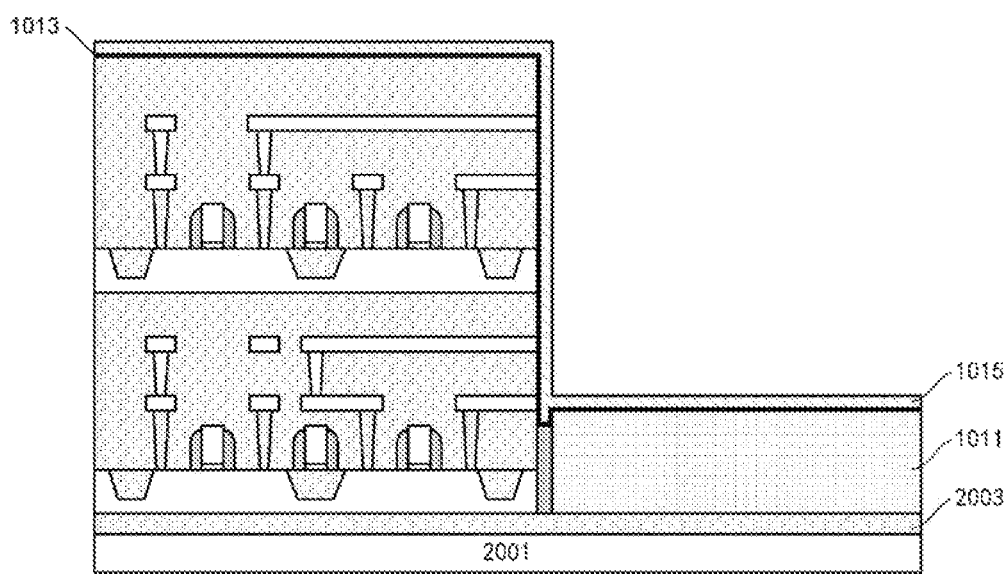

Then, as shown in FIG. 4, an exposed part of the protection layer 1009 may be removed by selective etching such as RIE to expose the conductive structure on the sidewall of the stack of element layers. A conductive barrier layer 1013 and a conductive body layer 1015 may be sequentially formed in a substantially conformal manner by deposition. The conductive barrier layer 1013 may prevent the conductive body layer 1015 from spreading to surroundings, and the conductive barrier layer 1013 may include, for example, conductive nitrides such as TiN, TaN, and the like. The conductive body layer 1015 may be used to realize an electrical connection between the elements, and may include metals such as tungsten (W), cobalt (Co), rubidium (Ru), copper (Cu), aluminum (Al), nickel (Ni), etc. The formed conductive barrier layer 1013 and the conductive body layer 1015 may be in contact with and connected to the conductive structure in the first interconnection wire layer of the element layer L1.

Then, the conductive barrier layer 1013 and the conductive body layer 1015 may be patterned for the conductive structure of the first interconnection wire layer in the element layer L1. In this example, a part of the conductive barrier layer 1013 and the conductive body layer 1015 on the top surface of the dielectric layer 1011 is to be left, and a mask covering the part may be formed.

Figure 5:
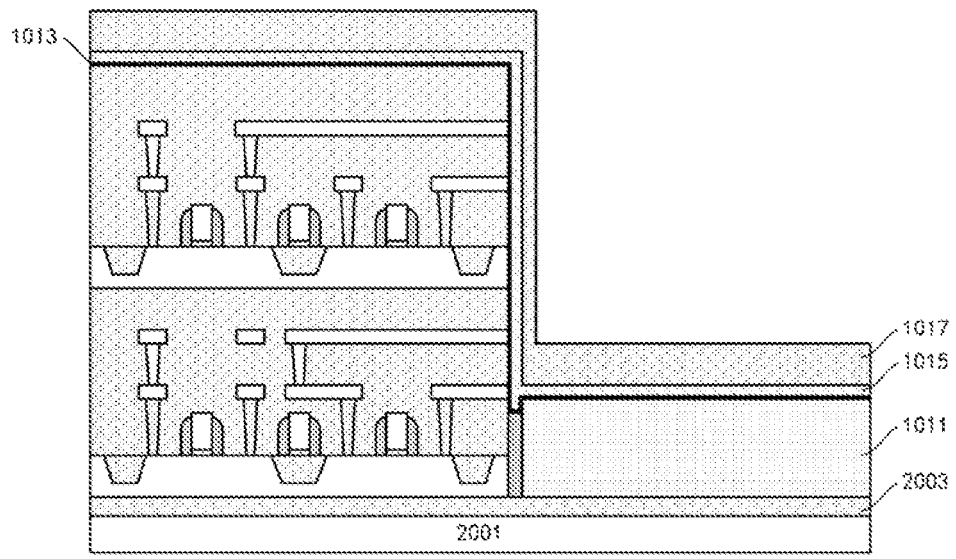

For example, as shown in FIG. 5, a mask layer 1017 may be formed by deposition. In order to form the mask as described above, a laterally extending portion of the mask layer 1017 is thicker, and a vertically extending portion of the mask layer 1017 is thinner. For example, this may be achieved by high density plasma (HDP) deposition. A thickness of a thicker portion of the mask layer 1017 may be about 20 to 150 nm.

Figure 6:
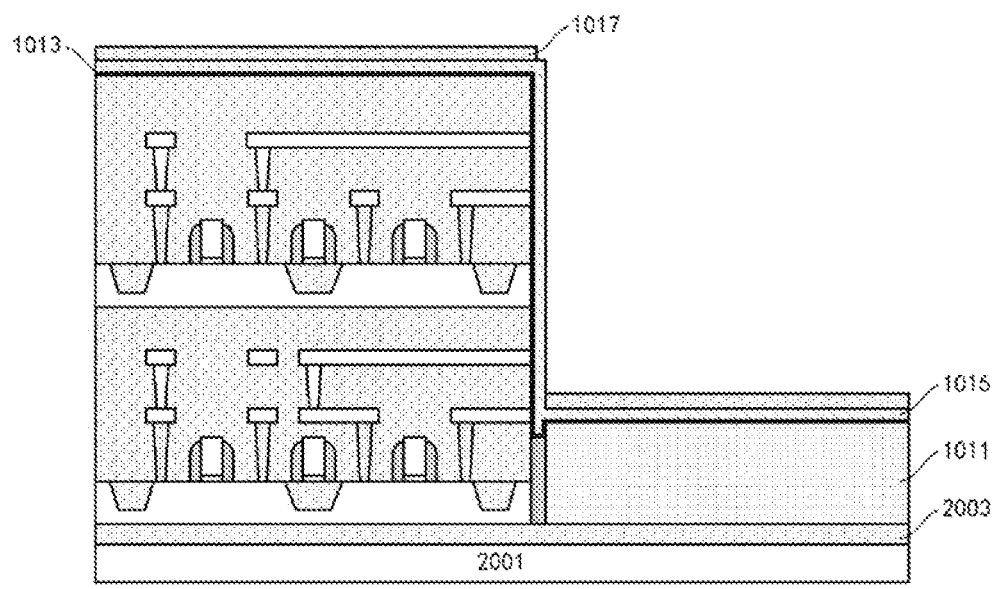

Then, as shown in FIG. 6, the mask layer 1017 may be etched isotropically, and a thickness of etching may be such that the vertically extending portion of the mask layer 1017 is removed, and the laterally extending portion of the mask layer 1017 is remained. For example, a thickness of the remaining portion may be about 15 to 100 nm. Thus, the conductive barrier layer 1013 and the conductive body layer 1015 on the top surface of the dielectric layer 1011 may be covered by the mask layer 1017.

Figure 7:
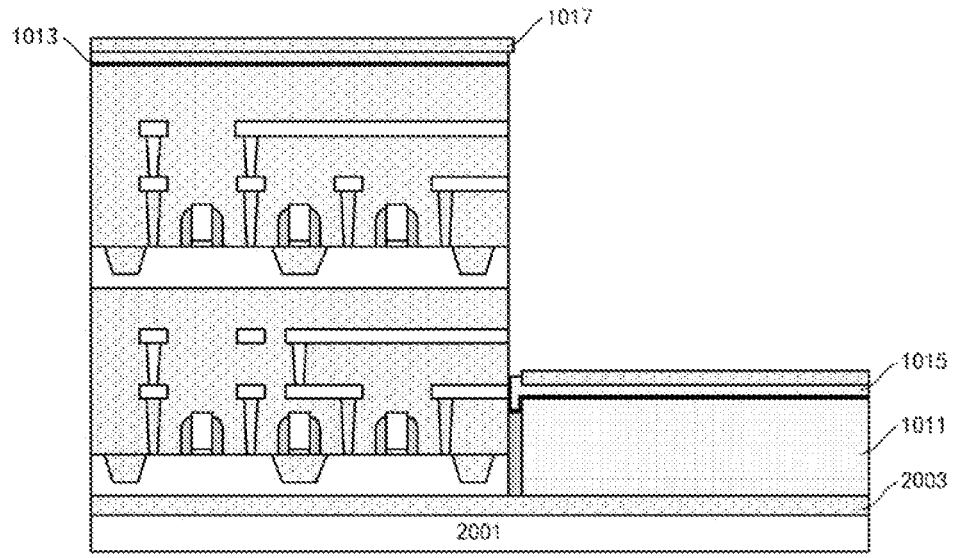

Next, as shown in FIG. 7, the mask layer 1017 may be used as an etching mask to perform isotropic etching on the conductive barrier layer 1013 and the conductive body layer 1015, so that the conductive barrier layer 1013 and the conductive body layer 1015 may be remained on the top surface of the dielectric layer 1011 (and some parts of the conductive barrier layer 1013 and the conductive body layer 1015 remain on the top surface of the stack of element layers, which will be removed in a subsequent process). The ALE may be used to realize a good etching control. After that, the mask layer 1017 may be removed.

The method of forming the mask is not limited to the above-mentioned method. For example, instead of forming the mask layer 1017, a photoresist may be formed on the structure shown in FIG. 4, for example, by spin coating. The photoresist may be exposed. A depth of light entering the photoresist may be controlled so that only an upper part of the photoresist is exposed. The exposed upper part of the photoresist may be removed by development. Thus, the photoresist with a certain thickness may be remained on the top surface of the dielectric layer 1011. The photoresist may be used as the etching mask to perform isotropic etching on the conductive barrier layer 1013 and the conductive body layer 1015 so that they are remained on the top surface of the dielectric layer 1011. After that, the photoresist may be removed.

Figure 8:
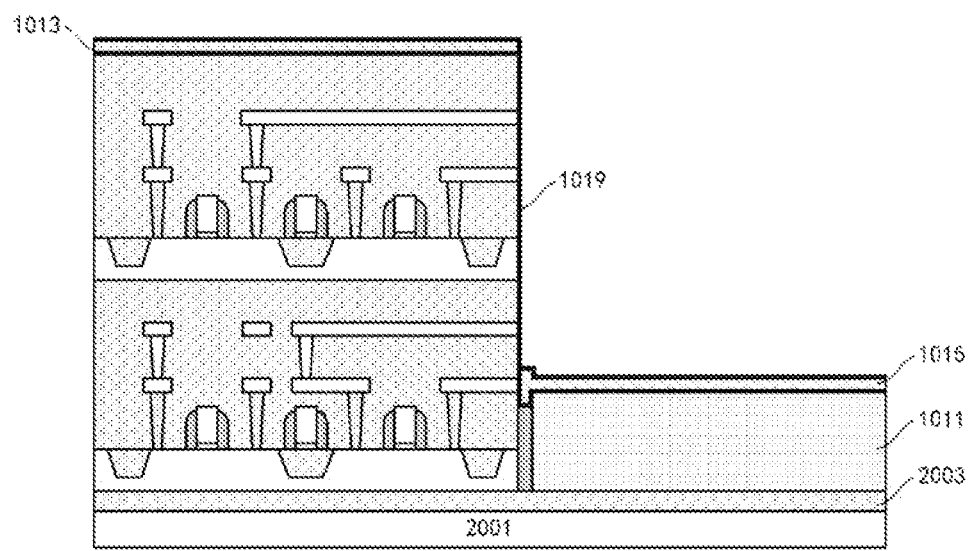
Figure 9:
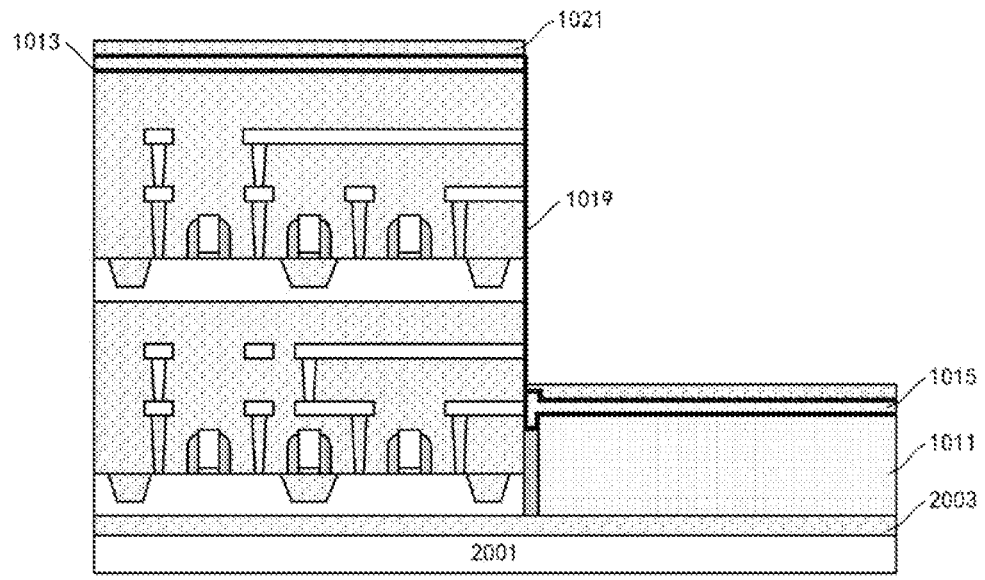
Figure 10:
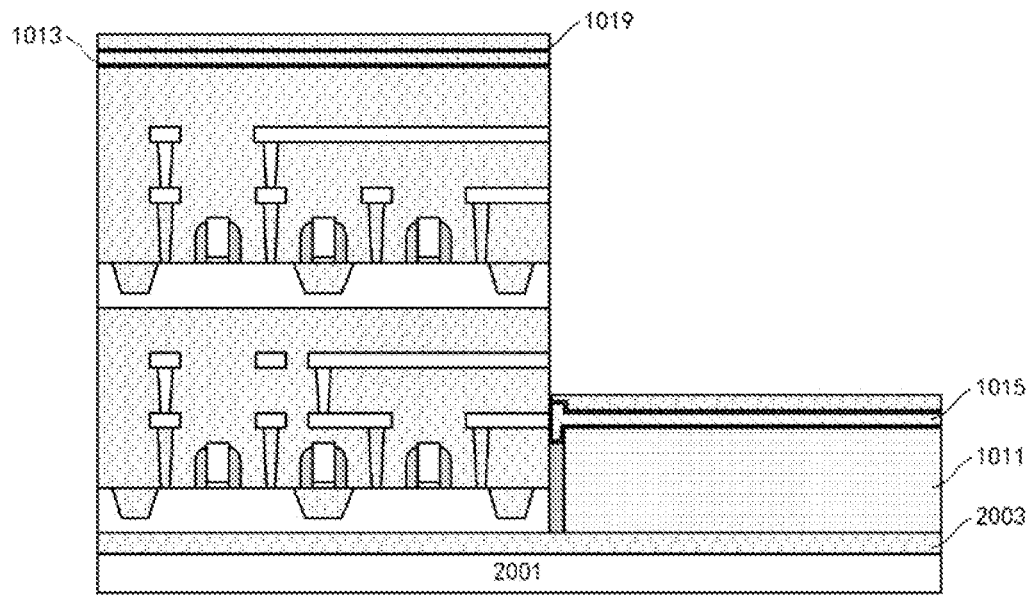

A top surface of the conductive body layer 1015 is exposed to the outside. In order to prevent the conductive body layer 1015 from spreading, a barrier layer may be formed on the top surface of the conductive body layer 1015. For example, as shown in FIG. 8, a conductive barrier layer 1019 may be formed in a substantially conformal manner by deposition. The conductive barrier layer 1019 and the conductive barrier layer 1013 may include a same material or different materials. Then, as shown in FIG. 9, the method described above in conjunction with FIGS. 5 and 6 may be used to form a mask layer 1021 such as oxide mask layer, and as shown in FIG. 10, the conductive barrier layer 1019 may be isotropic etched by using the mask layer 1021 so that the conductive barrier layer 1019 may be remained on the top surface of the dielectric layer 1011 (some parts of the conductive barrier layer 1019 remain on the top surface of the stack of element layers, which will be removed in a subsequent process).

Next, the conductive body layer 1015 covered by the conductive barrier layers 1013, 1019 may be patterned. The alignment mark in the element layer L1 may be referenced to facilitate pattern positioning.

Figure 11A:
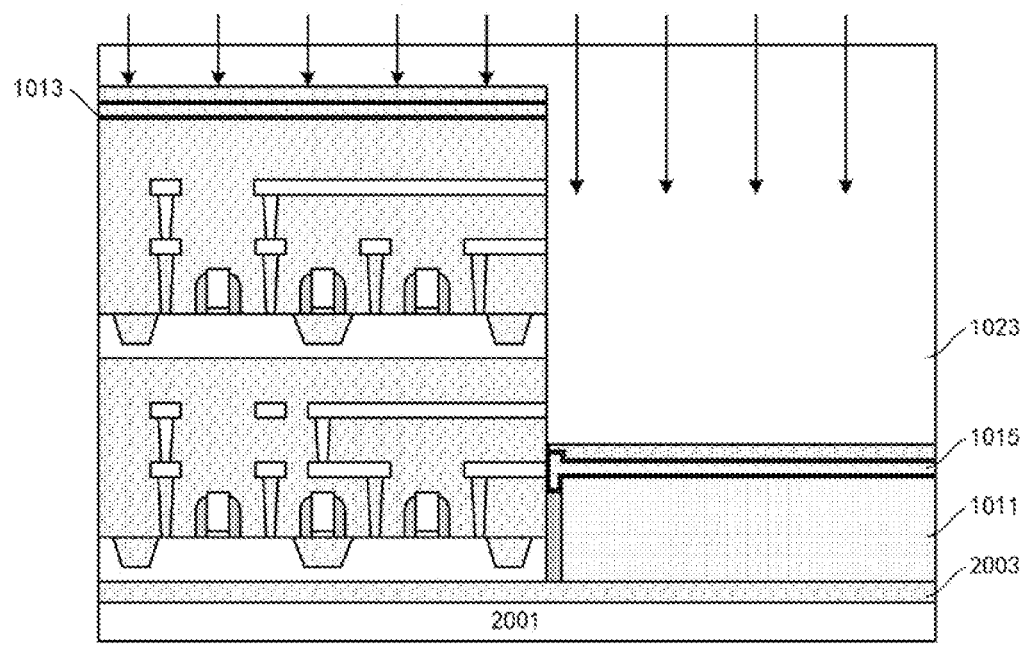
Figure 12A:
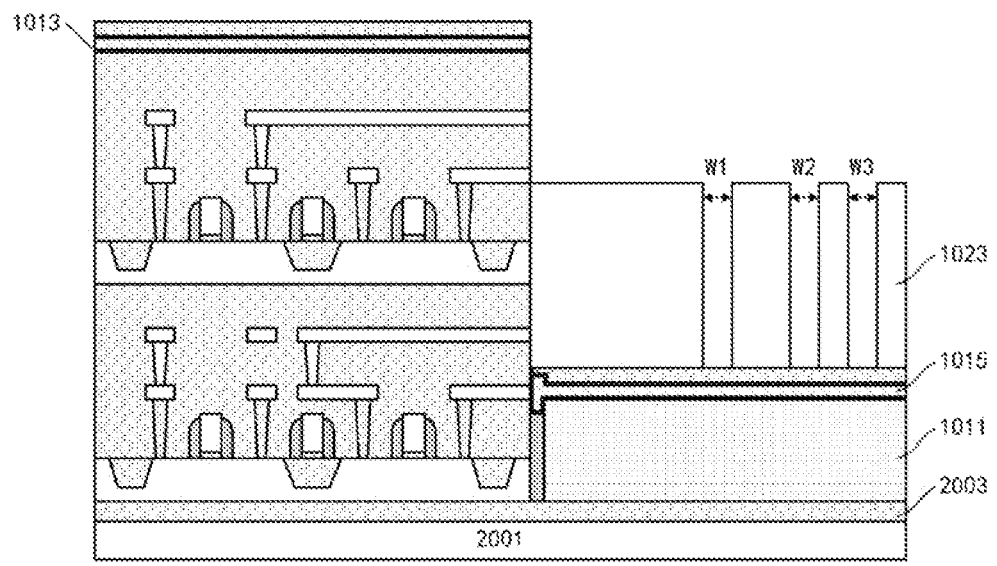

According to the embodiments, in order to prevent the photoresist from being too thick to affect an exposure effect and to remove the conductive barrier layers 1013, 1019 and the conductive body layer 1015 on the stack of element layers, the mask such as photoresist for patterning the conductive structure may be limited to be on the dielectric layer 1011. For example, as shown in FIG. 11A, a photoresist 1023 may be spin coated and exposed. A depth of light entering the photoresist may be controlled so that only an upper part of the photoresist is exposed. The exposed upper part of the photoresist may be removed by development. Thus, the photoresist with a certain thickness may be remained on the top surface of the dielectric layer 1011 (see FIG. 12A). Then, as shown in FIG. 12A, a mask for the conductive structure may be used to expose the remaining photoresist again. For registration purposes, the alignment mark may be used. After patterning, minimum widths W1, W2, and W3 (which defines a minimum gap between subsequently formed conductive structures) of respective openings in the photoresist may be substantially a same. This facilitates a consistency of subsequent processes. To ensure this consistency, a part of the conductive structures defined by the photoresist patterned as such may be dummy conductive structures.

Figure 11B:
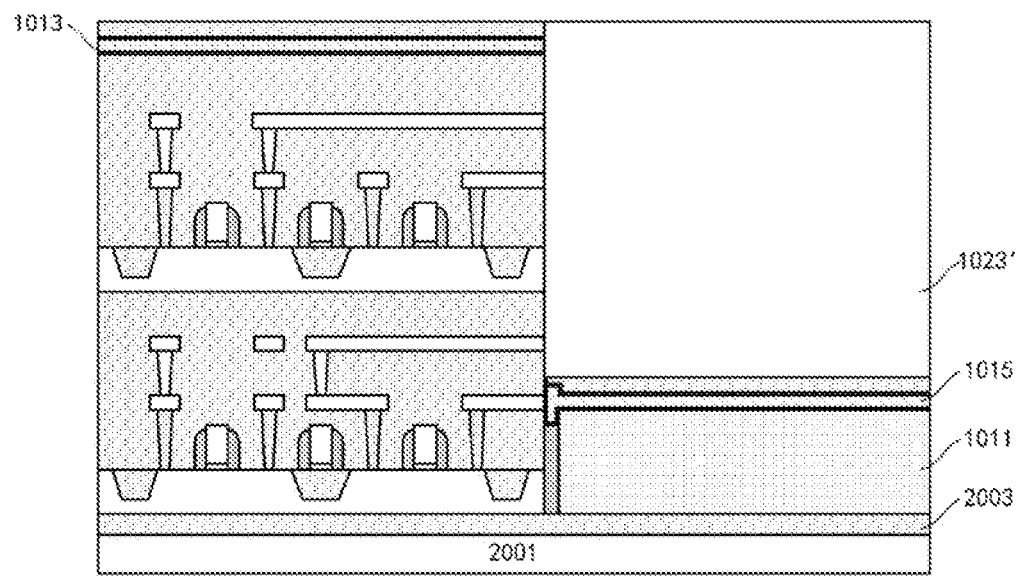
Figure 12B:
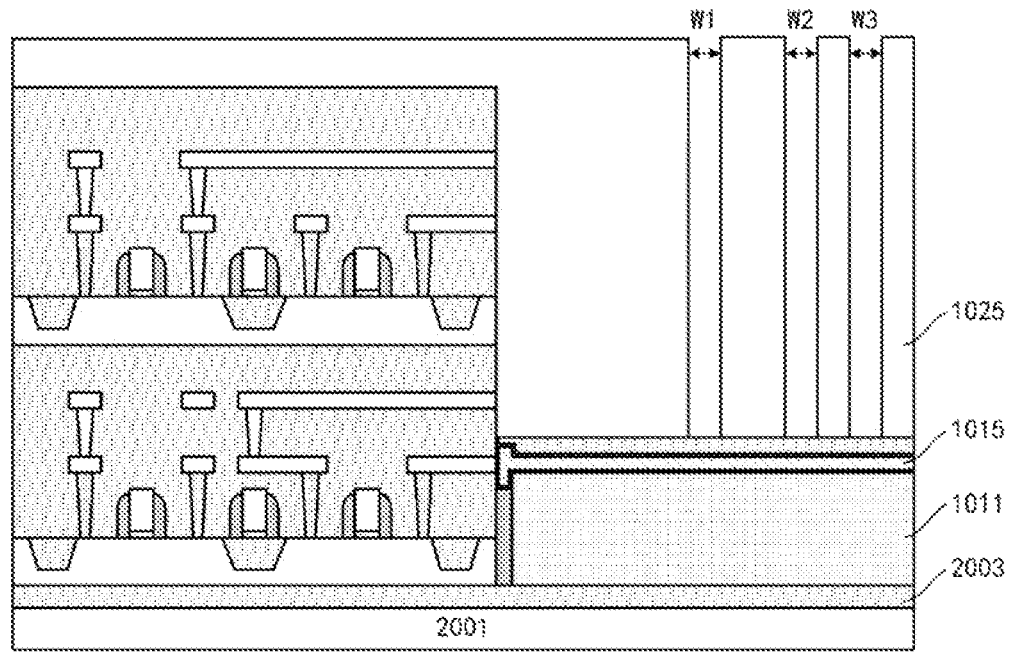

According to another embodiment, as shown in FIG. 11B, a photoresist/polymer 1023' may be spin coated and subjected to a planarization treatment such as CMP (which may be stopped at the mask layer 1021). As shown in FIG. 12B, selective etching such as RIE may be used to remove the mask layer 1021, the conductive barrier layers 1013, 1019, and the conductive body layer 1015 on the stack of element layers. After that, the photoresist/polymer 1023' may be removed. Then, a photoresist 1025 may further be spin coated, and the photoresist 1025 may be exposed using the mask for the conductive structure. For registration purposes, the alignment mark may be used. Similarly, minimum widths W1, W2, and W3 of respective openings in the photoresist patterned as such may be substantially a same.

Next, the photoresist 1023 shown in FIG. 12A is still used as the example of the mask for description.

Figure 13:
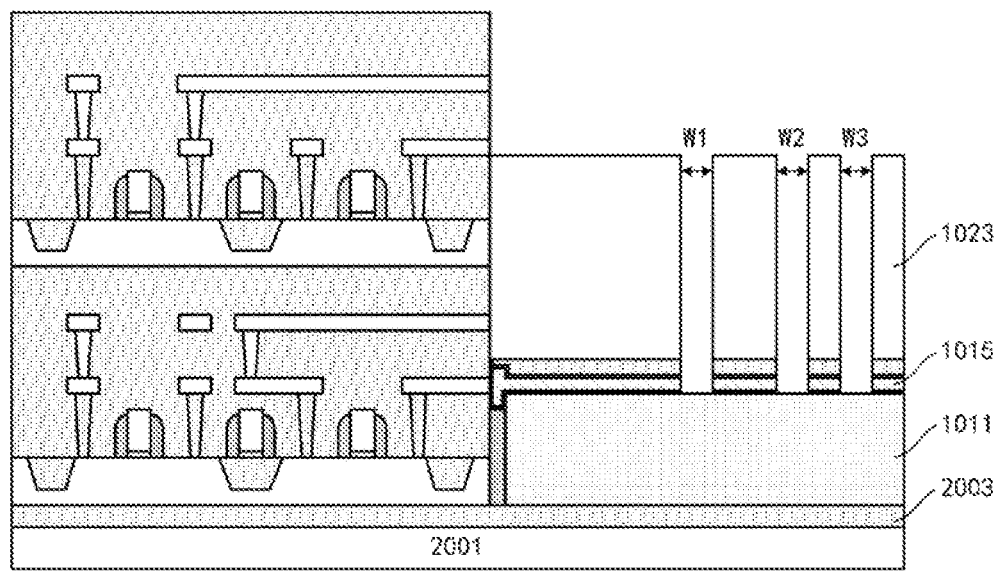

For example, as shown in FIG. 13, the photoresist 1023 may be used as the etching mask, and the mask layer 1021, the conductive barrier layer 1019, the conductive body layer 1015 and the conductive barrier layer 1013 may be selectively etched such as RIE in sequence. The etching may be stopped at the dielectric layer 1011 (or may enter the dielectric layer 1011 slightly to ensure that each conductive layer is cut off). In this way, a laterally extending conductive structure is formed on the top surface of the dielectric layer 1011 at a height corresponding to the first interconnection wire layer in the element layer L1, and at least a part of these conductive structures and the conductive structure in the first interconnection wire layer of the element layer L1 are in contact and therefore electrically connected. In addition, due to the etching step, residues on the top surface of the stack of element layers from the previous processes may be removed. After that, the photoresist 1023 may be removed.

Figure 14:
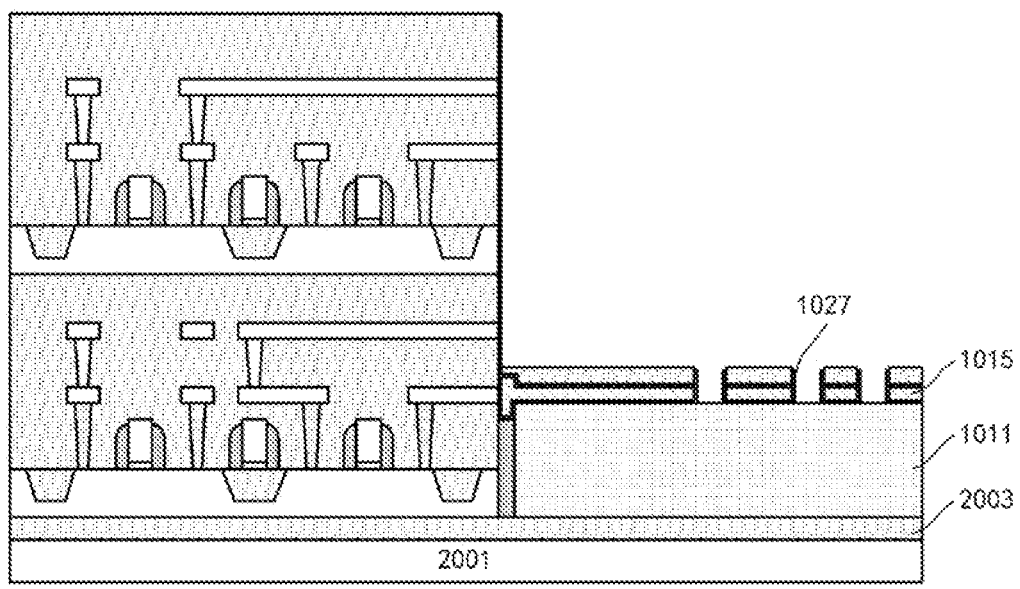

Due to this etching, some sidewalls of the conductive body layer 1015 are exposed to the outside. In order to prevent the conductive body layer 1015 from spreading, a conductive barrier layer may be formed on the exposed sidewalls of the conductive body layer 1015. For example, as shown in FIG. 14, a conductive barrier layer 1027 may be formed in a substantially conformal manner by deposition, and a laterally extending portion of the conductive barrier layer 1027 is removed and a vertically extending portion of the conductive barrier layer 1027 is remained by anisotropic etching such as RIE. Thus, the conductive barrier layer 1027 is formed in a form of spacers and remained on the exposed sidewalls of the conductive body layer 1015. The conductive barrier layer 1027 may include a same material or different materials as the conductive barrier layers 1013, 1019. In order to maintain consistency, the conductive barrier layers 1013, 1019, and 1027 may have a same material and substantially a same film thickness.

Figure 15:
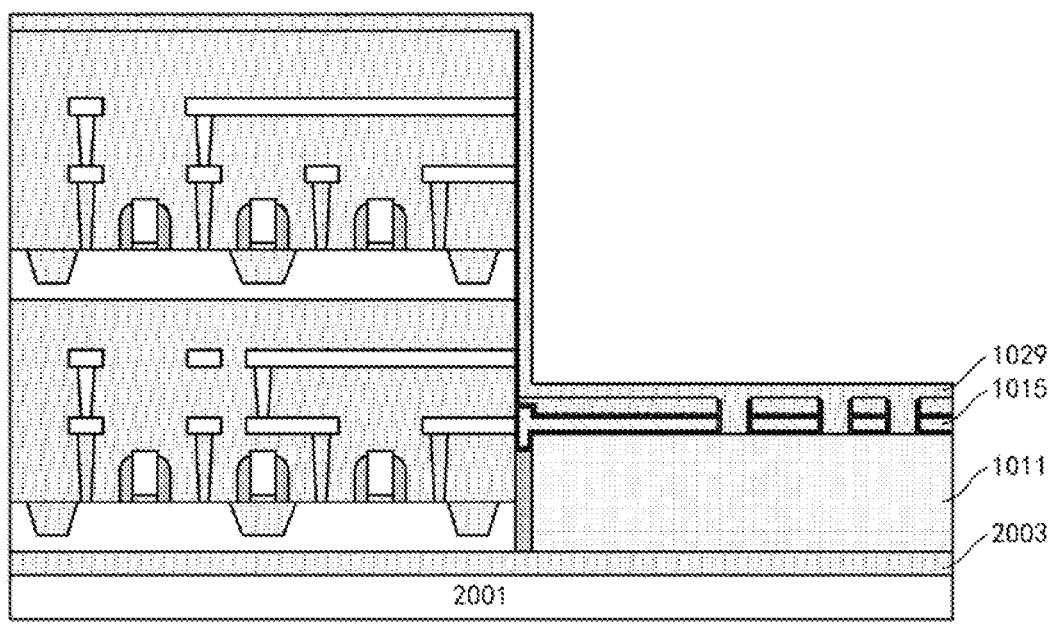
Figure 16:
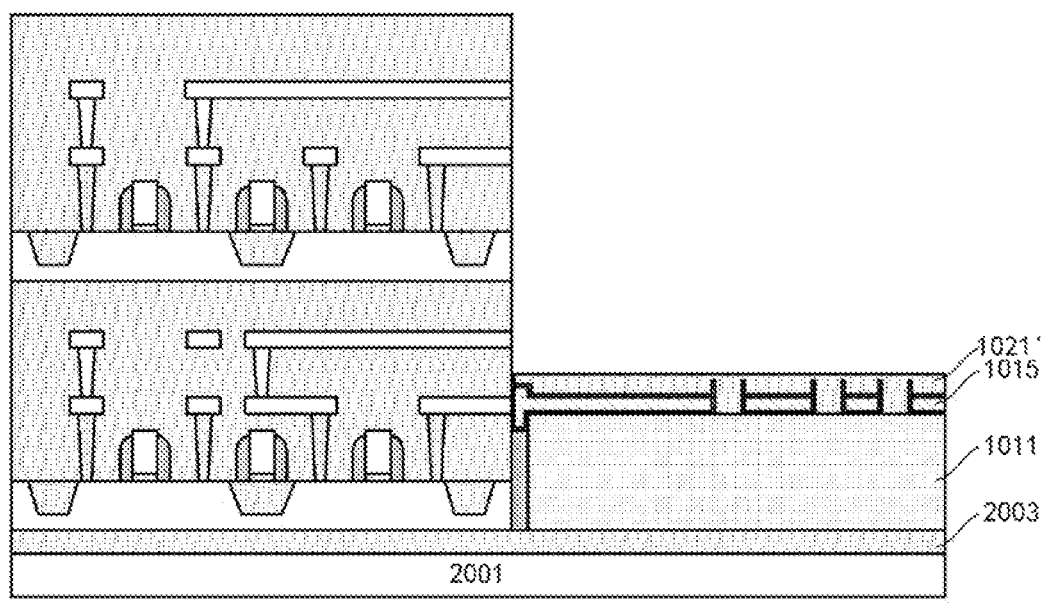

The conductive barrier layer 1027 in the form of spacers only needs to cover the conductive body layer 1015. For that, as shown in FIG. 15, a dielectric layer 1029 (for example, oxide) may be deposited. A thickness of the deposited dielectric layer 1029 may be greater than W1/2 (=W2/2=W3/2), so that a minimum gap between the conductive structures may be completely filled, which facilitates keeping a top surface of the deposited dielectric layer 1029 relatively flat. Then, as shown in FIG. 16, the deposited dielectric layer 1029 may be etched back to bury the previously formed conductive structure. Here, for convenience only, the dielectric layer 1029 and the mask layer 1021 that may still remain are shown as a whole, which is labeled as 1021'.

In order to ensure that the top surface of the dielectric layer 1029 has a certain flatness (even when the planarization process is not performed) to facilitate subsequent photolithography, the conductive structure may include some dummy patterns (that is, interconnection wires and/or via holes that do not realize a real electrical connection) so that the minimum gap may be kept substantially the same as described above. In addition, a thickness of the deposited film may be greater than half of the minimum gap. In order to better control a flatness of the dielectric layer 1029, atomic layer deposition (ALD) may be used for its deposition, and ALE may be used for its etch-back.

Then, a part of the conductive barrier layer 1027 exposed by the dielectric layer 1021' may be removed by selective etching such as RIE. In this way, the conductive body layer 1015 is encapsulated by the conductive barrier layers 1013, 1019, and 1027. There is an interface or boundary between the conductive structure formed as such and the conductive structure of the metallization layer in the stack of element layers due to factors such as different materials, dislocation of up and down or front and back positions. In addition, there may also be an interface or boundary between the dielectric layer 1021' and the interlayer dielectric layer in the stack of element layers.

A conductive structure layer is formed above. Each conductive structure layer may be formed one by one in a same or similar manner.

Figure 17:
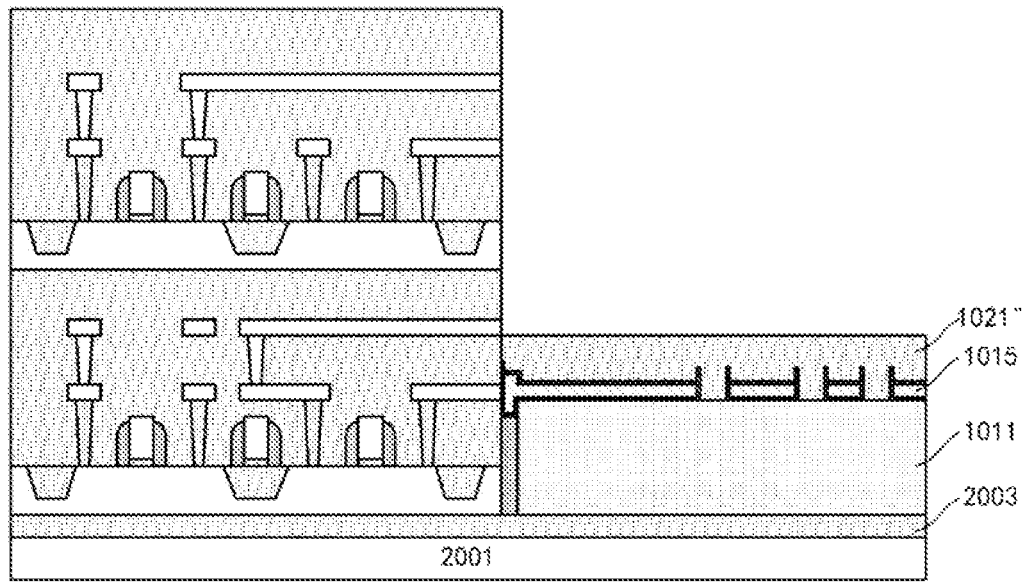

Next, for example, conductive structures for the second interconnection wire layer in the element layer L1 may be formed. The conductive structures to be formed may be located at a height corresponding to the second interconnection wire layer in the element layer L1. For that, as shown in FIG. 17, the top surface of the dielectric layer 1021' may be increased to a height corresponding to the second interconnection wire layer in the element layer L1 (for example, close to but lower than a bottom surface of the second interconnection wire layer in the element layer L1) by depositing and then etching back for example, oxide (alternatively, a material different from that of the dielectric material 1021'). The increased dielectric layer is marked as 1021" in the drawing. It should be noted that, although the dielectric layer 1021" is shown as a whole here, there may be an interface or boundary between successively formed dielectric layers.

Figure 18:
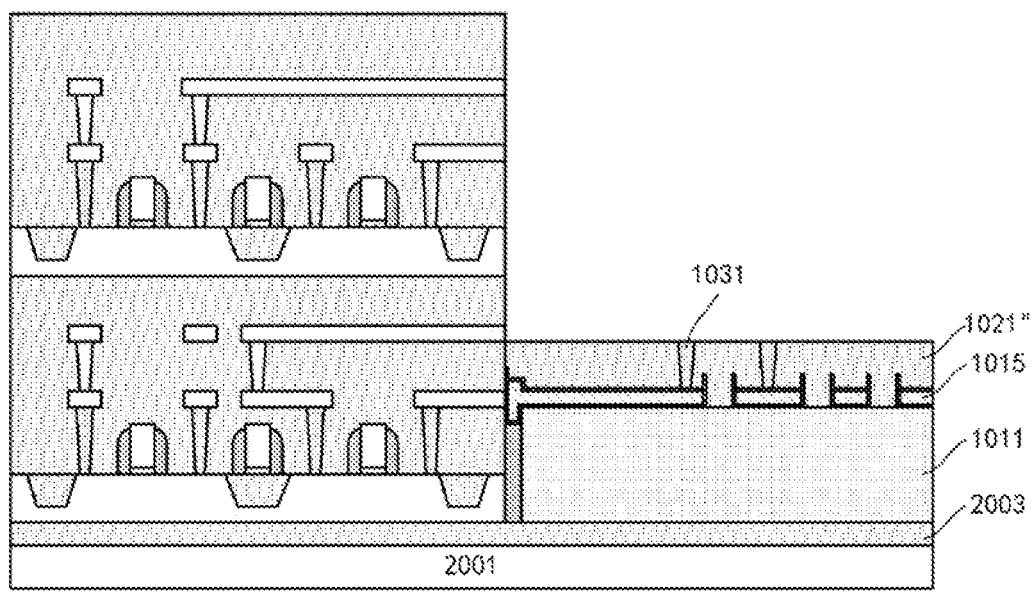

As shown in FIG. 18, via holes 1031 may be formed in the dielectric layer 1021" by, for example, etching holes and filling the holes with a conductive barrier layer such as conductive nitride and a conductive material such as metal. The via holes 1031 may realized an electrical connection between the upper and lower layers. One or more via holes 1031 adjacent to the sidewall of the stack of element layers may be in direct contact with the conductive structures exposed on the sidewall of the stack of element layers.

Figure 19:
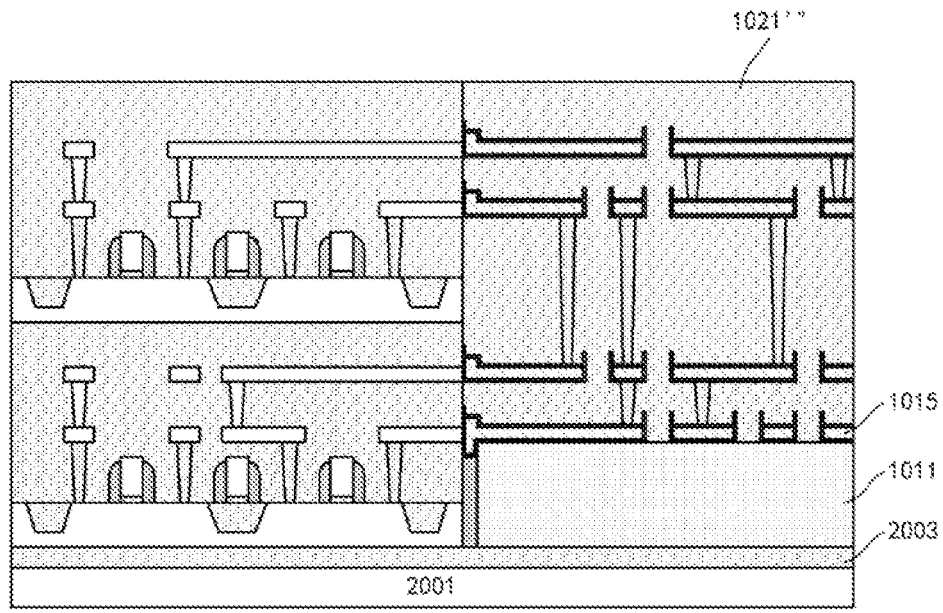

In addition, as shown in FIG. 19, as described above in conjunction with FIGS. 4 to 16, conductive structures for the second interconnection wire layer in the element layer L1 may be formed on the dielectric layer 1021".

Then, the height of the dielectric layer 1021" may be further increased, and the conductive structures for each element layer may be formed in sequence according to the above-mentioned method. Therefore, the conductive structures may be formed layer by layer to form the interconnection structure. In FIG. 19, the dielectric layer between the conductive structures in the interconnection structure is shown as 1021'''. At least a part of the aforementioned interface or boundary in each layer may be substantially coplanar, for example, substantially aligned in the vertical direction.

In the above-mentioned embodiments, the sidewall interconnection structure may realize the interconnection between different element layers in the stack of element layers. Alternatively or additionally, the sidewall interconnection structure may also realize the interconnection between different stacks of element layers.

Figure 20:
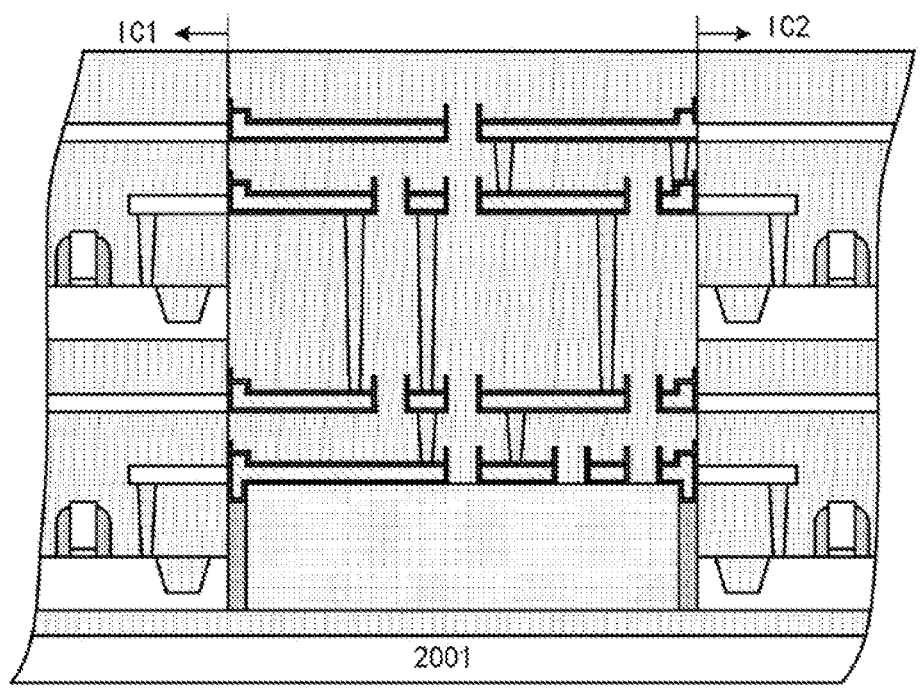
FIGS. 20 and 21 schematically show a semiconductor device, particularly an interconnection structure therein according to the embodiments of the present disclosure.
Figure 21:
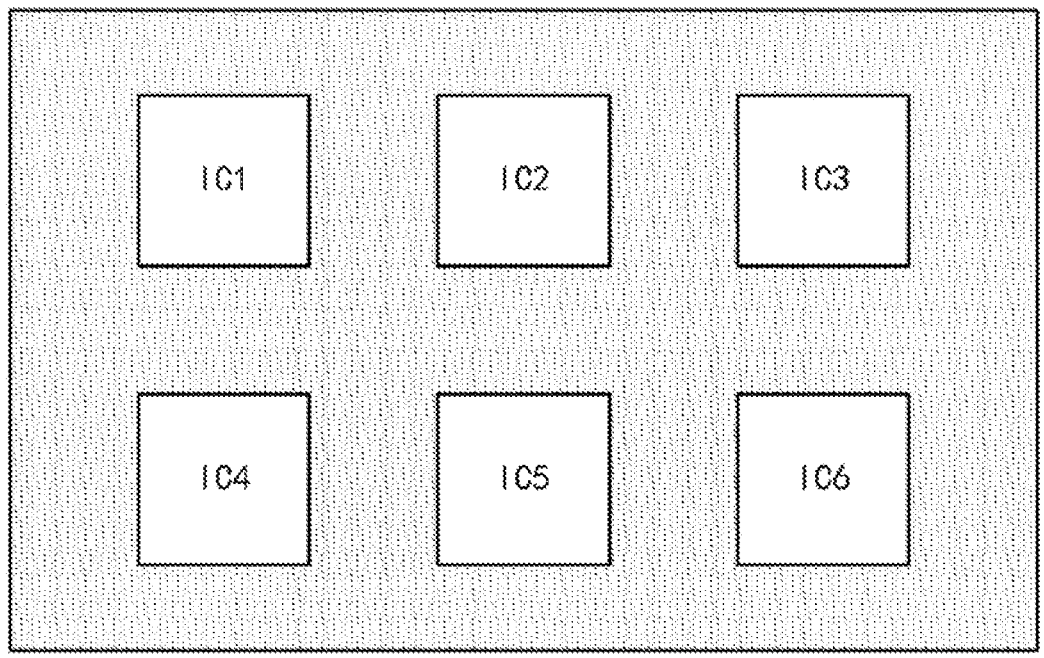

FIGS. 20 and 21 schematically show the semiconductor device, particularly the interconnection structure therein according to another embodiment of the present disclosure. FIG. 20 is a partial cross-sectional view, and FIG. 21 is a top view. For clarity, FIG. 20 and FIG. 21 are not drawn on a same scale.

As shown in FIGS. 20 and 21, a plurality of stacks of element layers, such as a plurality of ICs, that is, IC1, IC2, IC3, IC4, IC5, and IC6 may be provided on the carrier wafer or substrate 2001. Each IC may have a same layout and function or different layouts and functions. The sidewall interconnection structure may surround each IC, interconnect different element layers in each IC, and may interconnect each IC with each other.

According to the embodiments of the present disclosure, for a vertical stack of semiconductor elements, a sidewall interconnection structure laterally adjoined thereto may be provided. Compared with a conventional three-dimensional (3D) stacking method (for example, a 2.5D interposer), the present disclosure may have a smaller interconnection length, and therefore may have a low resistance and a high bandwidth. In addition, for existing integrated circuits (ICs), a programmable interconnection structure may be realized.

The semiconductor device according to the embodiments of the present disclosure may be applied to various electronic apparatuses. Therefore, the present disclosure further provides an electronic apparatus including the above-mentioned semiconductor device. The electronic apparatus may also include components such as a display screen and a wireless transceiver, etc. Such electronic apparatus is for example a smart phone, a personal computer (PC), a tablet, an artificial intelligence apparatus, a wearable device, a mobile power supply, and so on.

According to the embodiments of the present disclosure, a method for manufacturing a system on chip (SoC) is further provided. The method may include the method described above. Specifically, a variety of devices may be integrated on the chip, at least some of which are manufactured according to the method of the present disclosure.

In the above description, technical details such as patterning and etching for each layer are not explained in detail. However, those skilled in the art should understand that various technical means may be used to form layers, regions, etc. of desired shapes. In addition, in order to form the same structure, those skilled in the art may also design a method that is not completely the same as the method described above. In addition, although each embodiment is described above respectively, this does not mean that the measures in each embodiment may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

What is claimed is:

1. A semiconductor device, comprising:
a vertical stack comprising a plurality of element layers, wherein each element layer of the plurality of element layers comprises a plurality of semiconductor elements and a metallization layer for the plurality of semiconductor elements; and an interconnection structure laterally adjoined the vertical stack,
wherein the interconnection structure comprises:
an electrical isolation layer; and
a conductive structure in the electrical isolation layer, wherein at least a part of a conductive structure in the metallization layer of the each element layer is in contact with and electrically connected to the conductive structure at a corresponding height in the interconnection structure in a lateral direction.

2. The semiconductor device according to claim 1, wherein the conductive structure in the interconnection structure comprises at least one of an interconnection wire or a via hole.

3. The semiconductor device according to claim 2, wherein the conductive structure of the interconnection structure comprises an interconnection wire layer and a via hole layer arranged alternately, and wherein the interconnection wire is provided in the interconnection wire layer, and the via hole is provided in the via hole layer.

4. The semiconductor device according to claim 1, wherein an interface exists between the conductive structure in the metallization layer and the conductive structure in the interconnection structure.

5. The semiconductor device according to claim 1, wherein an interface exists between an interlayer dielectric layer in the metallization layer and the electrical isolation layer in the interconnection structure.

6. The semiconductor device according to claim 4, wherein at least parts of interfaces at different element layers in the vertical stack are substantially coplanar in a vertical direction.

7. The semiconductor device according to claim 1, wherein the metallization layer of the each element layer comprises:
a first interconnection wire layer at a first height;
a second interconnection wire layer at a second height; and
a via hole layer between the first interconnection wire layer and the second interconnection wire layer, wherein the via hole layer electrically connects a conductive structure in the first interconnection wire layer and a conductive structure in the second interconnection wire layer, and
wherein at least some conductive structures in the first interconnection wire layer and the second interconnection wire layer extend laterally toward the interconnection structure, and are in contact with conductive structures at corresponding heights in the interconnection structure.

8. The semiconductor device according to claim 1, wherein the interconnection structure comprises a dummy conductive structure.

9. The semiconductor device according to claim 8, wherein in the interconnection structure, a minimum gap between the conductive structures, a minimum gap between the conductive structure and the dummy conductive structure, and a minimum gap between the dummy conductive structures in the same layer are substantially a same.

10. The semiconductor device according to claim 1, wherein the interconnection structure surrounds the vertical stack.

11. The semiconductor device according to claim 1, wherein a plurality of vertical stacks are provided, and each of the plurality of vertical stacks is surrounded by the interconnection structure.

12. The semiconductor device according to claim 1, wherein the electrical isolation layer comprises a dielectric layer.

13. The semiconductor device according to claim 1, wherein the conductive structure comprises at least one of W, Co, Ru, Cu, Al, Ti, Ni, or Ta.

14. The semiconductor device according to claim 2, wherein the interconnection wire comprises a body portion and a barrier layer surrounding the body portion.

15. A method for manufacturing a semiconductor device, comprising:
stacking a plurality of element layers vertically, wherein each element layer of the plurality of element layers comprises a plurality of semiconductor elements and a metallization layer for the plurality of semiconductor elements;
providing a vertical stack comprising the plurality of element layers on a carrier substrate, and forming an interconnection structure laterally adjoined the vertical stack on the carrier substrate, wherein the interconnection structure comprises an electrical isolation layer and a conductive structure in the electrical isolation layer,
wherein the method further comprises: controlling a height of the conductive structure in the interconnection structure so that at least a part of a conductive structure in the metallization layer of the each element layer is in contact with and electrically connected to the conductive structure at a corresponding height in the interconnection structure in a lateral direction.

16. The method according to claim 15, wherein forming the interconnection structure comprises:
forming an interconnection wire layer and a via hole layer alternately, wherein an interconnection wire is provided in the interconnection wire layer, and a via hole is provided in the via hole layer.

17. The method according to claim 16, wherein forming the interconnection wire layer and the via hole layer comprises:
forming a dielectric material with a first height on the carrier substrate;
forming an interconnection wire on the dielectric material with the first height, wherein the first height is set so that an interconnection wire and a corresponding conductive structure in the vertical stack are at a substantially same height;
forming a dielectric material with a second height on the carrier substrate, wherein the second height is set so that an interconnection wire formed thereon subsequently and a corresponding conductive structure in the vertical stack are at a substantially same height; and
forming a via hole in the dielectric material with the second height.

18. The method according to claim 17, wherein forming the interconnection wire comprises:
forming a conductive material layer on the dielectric material with the first height;
patterning the conductive material layer into a plurality of line patterns extending in a plane, wherein interconnection wires are formed by at least some of the line patterns, and
wherein a minimum gap between the line patterns is substantially the same.

19. The method according to claim 18, further comprising: forming a conductive barrier layer surrounding the line patterns.

20. An electronic apparatus, comprising the semiconductor device according to claim 1.

21. The electronic apparatus according to claim 20, wherein the electronic apparatus comprises a smart phone, a personal computer, a tablet, an artificial apparatus, a wearable apparatus and a portable power supply.

* * * * *